US012744522B2

(12) United States Patent
Paul et al.

(10) Patent No.: US 12,744,522 B2
(45) Date of Patent: Sep. 22, 2026

(54) FAULT TOLERANT DRIVER CIRCUIT

(71) Applicant: NXP USA, Inc., Austin, TX (US)

(72) Inventors: Carl-Hinrich Paul, Basel (CH); Hubert Michel Grandry, Espanes (FR); Markus Hafermalz, Teltow (DE); Tristan Bosvieux, Plaisance du Touch (FR)

(73) Assignee: NXP USA, Inc., Austin, TX (US)

( * ) Notice: Subject to any disclaimer, the term of this patent is extended or adjusted under 35 U.S.C. 154(b) by 27 days.

(21) Appl. No.: 18/771,275

(22) Filed: Jul. 12, 2024

(65) Prior Publication Data

US 2025/0023560 A1 Jan. 16, 2025

(30) Foreign Application Priority Data

Jul. 14, 2023 (EP) .................................... 23306225

(51) Int. Cl.
*H03K 17/06* (2006.01)
*H03K 17/0812* (2006.01)

(52) U.S. Cl.
CPC ..... *H03K 17/063* (2013.01); *H03K 17/08122* (2013.01); *H03K 2217/0063* (2013.01); *H03K 2217/0072* (2013.01)

(58) Field of Classification Search
CPC ........... H03K 17/063; H03K 17/08122; H03K 2217/0063; H03K 2217/0072
See application file for complete search history.

(56) References Cited

U.S. PATENT DOCUMENTS

| | | | |
|---|---|---|---|
| 7,932,622 B2 | 4/2011 | Chiozzi et al. | |
| 9,176,179 B2 | 11/2015 | Hemon et al. | |
| 10,583,794 B2 * | 3/2020 | Colarossi | B60R 21/0173 |
| 10,840,900 B2 | 11/2020 | Colarossi et al. | |
| 2005/0225924 A1 | 10/2005 | Sibrai | |
| 2005/0269879 A1 | 12/2005 | Hemon et al. | |
| 2008/0086250 A1 | 4/2008 | Kuivenhoven | |
| 2015/0361942 A1 | 12/2015 | List et al. | |
| 2016/0362078 A1 * | 12/2016 | Hayashi | H02J 7/34 |
| 2019/0299894 A1 | 10/2019 | Colarossi et al. | |
| 2021/0013708 A1 | 1/2021 | Kambham | |
| 2021/0296884 A1 | 9/2021 | Erhart et al. | |

FOREIGN PATENT DOCUMENTS

JP 6489949 B2 3/2019

* cited by examiner

*Primary Examiner* — Menatoallah Youssef
*Assistant Examiner* — Colleen J O Toole

(57) ABSTRACT

One example discloses a driver circuit, including: a high-side element coupled to receive a supply voltage and configured to be coupled to a first terminal of a load; a low-side element coupled to a ground and configured to be coupled to a second terminal of the load; a controller coupled to activate both the high-side element and the low-side element at a same time; and a reverse current blocking element coupled between the voltage supply and the high-side element; wherein the reverse current blocking element is configured to permit current flow from the voltage supply to the high-side element, and to block current flow from the high-side element to the voltage supply.

21 Claims, 4 Drawing Sheets

FAULT TOLERANT DRIVER CIRCUIT

CROSS-REFERENCE TO RELATED APPLICATIONS

This application claims the priority under 35 U.S.C. § 119 of European Patent application no. 23306225.6, filed on 14 Jul. 2023, the contents of which are incorporated by reference herein.

The present specification relates to systems, methods, apparatuses, devices, articles of manufacture and instructions for driving electrical circuits.

SUMMARY

According to an example embodiment, a driver circuit, comprising: a high-side element coupled to receive a supply voltage and configured to be coupled to a first terminal of a load; a low-side element coupled to a ground and configured to be coupled to a second terminal of the load; a controller coupled to activate both the high-side element and the low-side element at a same time; and a reverse current blocking element coupled between the voltage supply and the high-side element; wherein the reverse current blocking element is configured to permit current flow from the voltage supply to the high-side element, and to block current flow from the high-side element to the voltage supply.

In another example embodiment, the reverse current blocking element is a diode.

In another example embodiment, the reverse current blocking element is a MOSFET configured to be controlled by the controller.

In another example embodiment, the controller is configured to activate the high-side element, the low-side element, and the MOSFET at the same time.

In another example embodiment, the high-side element is a first MOSFET; the reverse current blocking element is a second MOSFET; and the first and second MOSFETs are coupled in a back-to-back configuration.

In another example embodiment, the driver circuit is embedded in a BMS (Battery Management System) device.

In another example embodiment, the controller is configured to activate both the high-side element and the low-side element in response to a BMS safe command.

In another example embodiment, the load is at least one of an actuator, a pyro-electrical fuse, an igniter, or a squib.

In another example embodiment, further comprising an energy storage element coupled to the reverse current blocking element and coupled to receive the supply voltage.

In another example embodiment, the energy storage element is a capacitor.

In another example embodiment, further comprising a charging current limiter coupled between the voltage supply and the energy storage element.

In another example embodiment, the charging current limiter is configured to monitor a voltage at the energy storage element.

In another example embodiment, the charging current limiter is configured to block a charging current received from the supply voltage if the monitored voltage does not reach a predetermined voltage within a predetermined time.

In another example embodiment, the charging current limiter is configured to output an energy storage element failure signal upon blocking the charging current.

In another example embodiment, a driver system, wherein the driver circuit is a first driver circuit, the reverse current blocking element is a first reverse current blocking element, the voltage supply is a first voltage supply, and the high-side element is a first high-side element; further comprising a second driver circuit having a second high-side element coupled to receive a second supply voltage and configured to be coupled to the first terminal of the load; wherein the second driver circuit includes a second reverse current blocking element configured to permit current flow from the second voltage supply to the second high-side element, and to block current flow from the second high-side element to the second voltage supply.

In another example embodiment, the second driver circuit is coupled to the load in parallel with the first driver circuit; and the first driver circuit and the second driver circuit are configured to redundantly drive the load.

In another example embodiment, the first driver circuit and the second driver circuit are configured to redundantly drive the load in response to a single shared control signal.

In another example embodiment, when the first driver circuit and second driver circuit are configured to both drive the load at the same time.

In another example embodiment, the second reverse current blocking element is configured to block current flow from the first driver circuit to the second voltage supply.

In another example embodiment, the second voltage supply includes an energy storage element; and the second reverse current blocking element is configured to block current flow from the first driver circuit to the energy storage element in the second driver circuit in response to a failure condition in the energy storage element.

In another example embodiment, the first and second drivers are configured to actuate the load in any order.

In another example embodiment, the second drivers is configured to actuate the load after a delay from when the first driver was configured to actuate the load.

In another example embodiment, there is more than one load that is actuated by either or both of the first and second drivers.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1A:
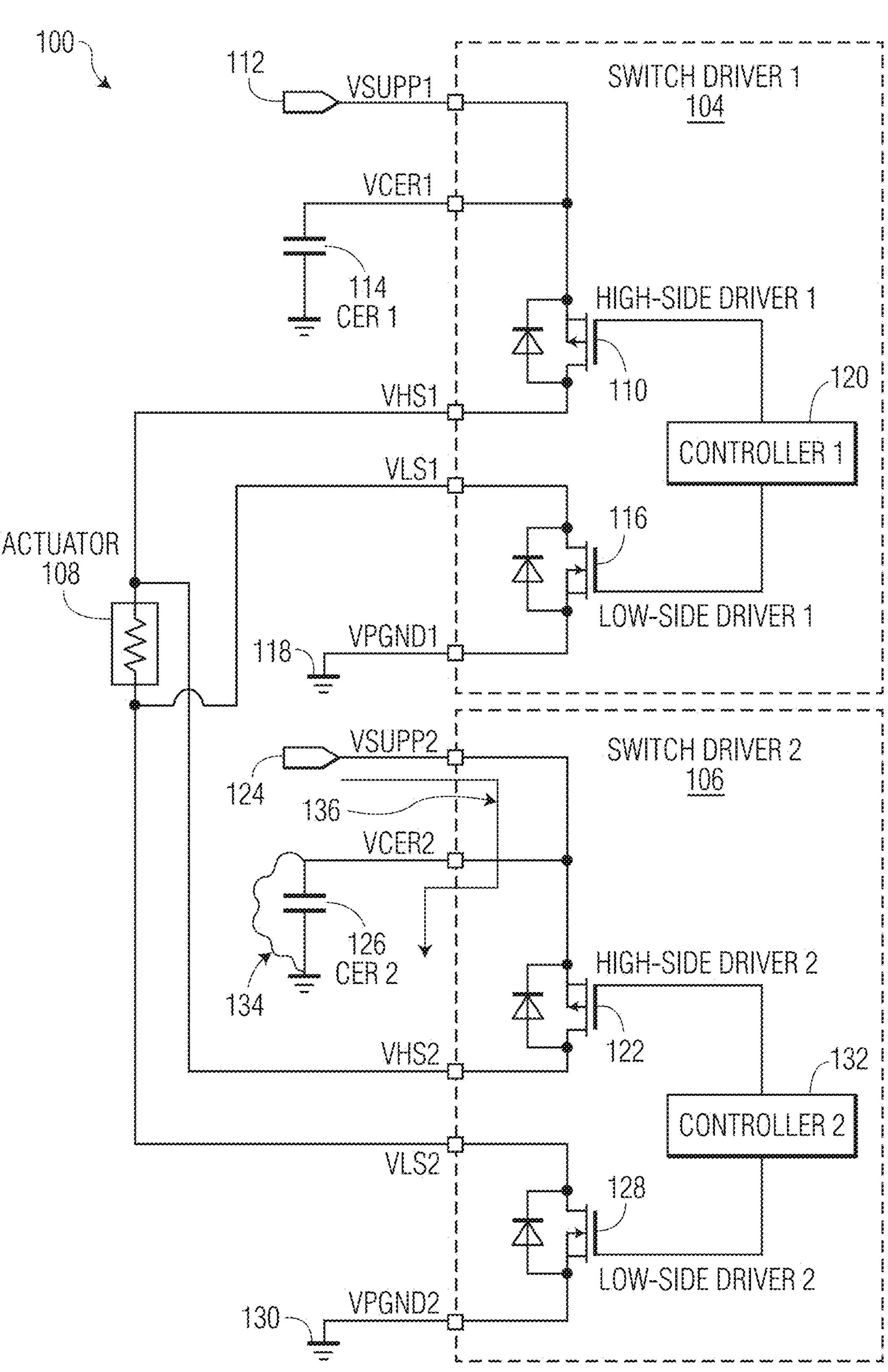
FIGS. 1A and 1B represent examples of driver fault scenarios.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Actuation of safety systems in certain applications can be more critical than others. For example, electrical vehicle batteries that include lithium-ion battery cells have an internal battery cell impedance which is very low. In case of short circuit, e.g. at inverter or electrical motor level, the battery current rapidly increases and presents a fire hazard and potential irreversible damages to contactors and/or other battery pack and vehicle elements.

In line fuses meant to limit such a current surge may be too slow to prevent an over-current condition that stresses many or all the battery cells in such vehicles, but could also overstress the contactors in series with the actuators.

Pyro-electrical switches are an alternative approach for quickly blocking a current surge. In some embodiments, the pyro-electrical switch circuit includes at least two switch drivers having independent circuitry, independent supply and independent energy reservoir capacitors.

However, such dual switch drivers may include energy reservoir capacitors (CERs) that themselves can fail. For example, a short circuiting the energy reservoir capacitor of one switch driver channel and deplete the energy reservoir capacitor of the other switch driver channel during simultaneous in parallel switch driver actuation of the pyro-electrical switch.

Thus instead of the redundant switch drivers providing additional assurance of actuating the pyro-electrical switch, a failure of one of the switch drivers (e.g. a failure of its CER) can prevent other backup switch drivers from actuating the pyro-electrical switch either, such as when a short circuit in one switch driver drains driver power (e.g. actuation energy) from the backup switch driver(s).

Figure 1B:
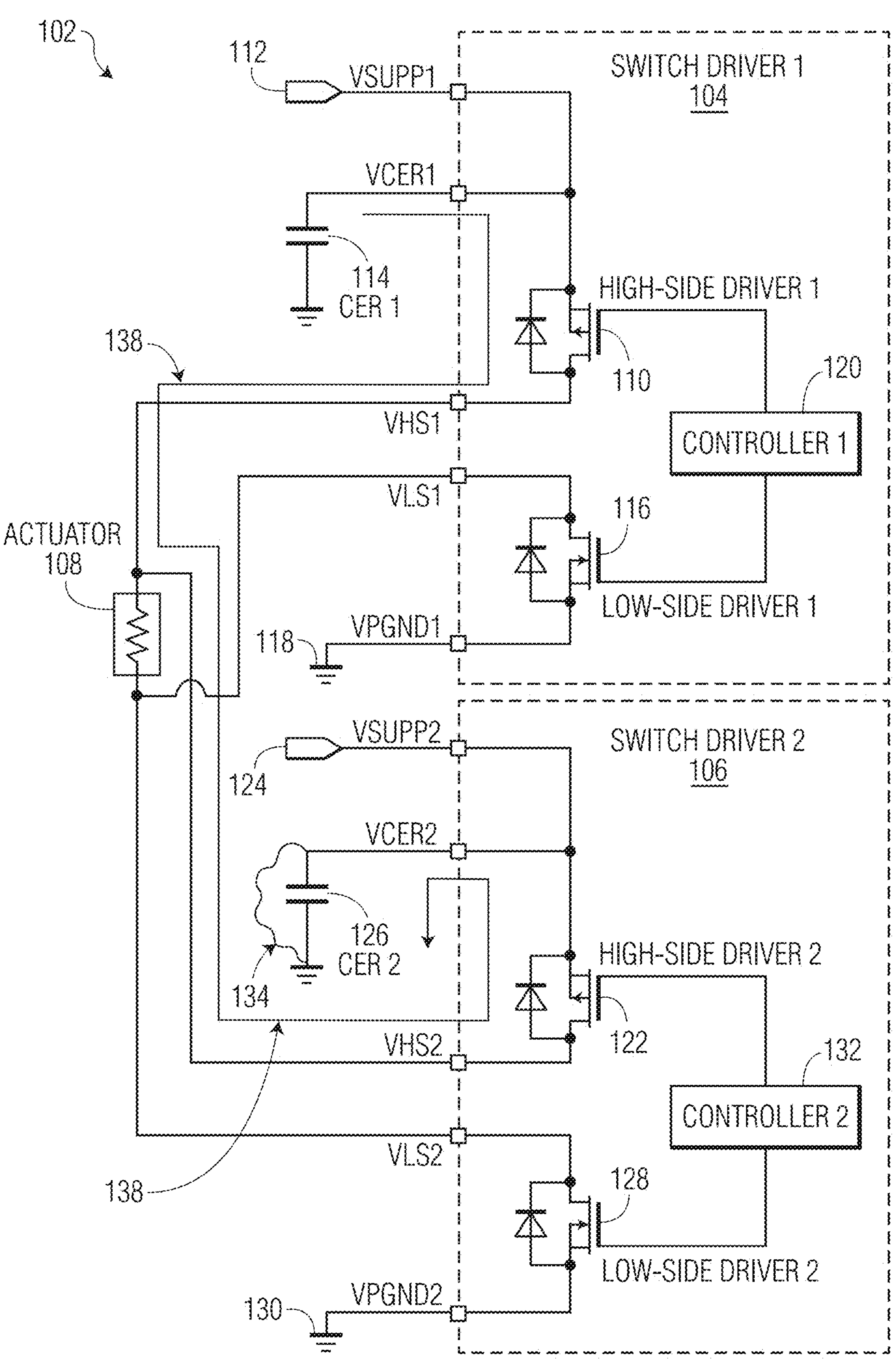

FIGS. 1A and 1B represent examples 100, 102 of driver fault scenarios. In both the first example driver fault scenario 100 and the second example driver fault scenario 102, a first driver circuit 104 (e.g. switch driver 1), a second driver circuit 106 (e.g. switch driver 2), and a load 108 (e.g. actuator, pyro-electrical switch, etc.) are shown.

In the first driver circuit 104 (e.g. switch driver 1) a first high-side element 110 (e.g. high-side driver 1) is coupled to a first supply voltage 112, a first energy storage element 114 (e.g. CER-1) and the load 108. A first low-side element 116 (e.g. low-side driver 1) is coupled to a first ground 118 (e.g. VPGND1) and the load 108. Both the first high-side element 110 and the first low-side element 116 are coupled to and controlled by a first controller 120 (e.g. controller 1).

In the second driver circuit 106 (e.g. switch driver 2) a second high-side element 122 (e.g. high-side driver 2) is coupled to a second supply voltage 124, a second energy storage element 126 (e.g. CER-2), and the load 108. A second low-side element 128 (e.g. low-side driver 2) is coupled to a second ground 130 (e.g. VPGND2) and the load 108. Both the second high-side element 122 and the second low-side element 128 are coupled to and controlled by a second controller 132 (e.g. controller 2).

The switch driver circuits 104, 106 are configured to simultaneously and in parallel drive the load 108 (e.g. regulate an actuation current across an igniter). In some example embodiments, the first and second driver circuits 104, 106 supplement the power received from the power supplies 112, 124 with charges stored in their energy storage elements 114 (e.g. CER-1) 126 (e.g. CER-2) to further help drive the load 108 (e.g. to fire/actuate the battery management safety squib).

In both the first example driver fault scenario 100 and the second example driver fault scenario 102, a short circuit 134 in the second energy storage element 126 (e.g. CER-2) is shown. In response to this short circuit 134, FIG. 1A shows a first current drain path 136, and FIG. 1B shows a second current drain path 138.

For example in FIG. 1A the short circuit 134 renders the second driver circuit 106 inoperative by draining not only the charge stored in the second energy storage element 126 (e.g. CER-2), but also charge received from the second supply voltage 124.

Additionally in FIG. 1B the short circuit 134 significantly reduces an ability of the first driver circuit 104 to drive the load 108 (e.g. to fire/actuate the battery management safety squib) by also draining the charge stored in the first energy storage element 114 (e.g. CER-1) and charge received from the first supply voltage 112.

Now discussed is a fault tolerant driver circuit that prevents a failure in the driver circuit from draining current from other driver circuits coupled to a driven load, such as an actuator, a pyro-electrical fuse igniter, a squib, or any other load. The discussed fault tolerant driver circuit is particularly useful for applications where more than one driver circuit is coupled in parallel to the load and are activated at a same time in response to a single shared control signal, but may or may not be actually driven at a same time or after a delay, making a risk of one or more of the driver circuits failing and such failure blocking proper actuation of the load.

The fault tolerant driver circuit includes a reverse current protection element that enables the driver circuit prevents a failure in the driver circuit from propagating to the other in parallel driver circuits.

Thus a set of fault tolerant driver circuits can redundantly drive a load device (e.g. a pyro-electrical igniter, or anything) using independent energy reservoirs/sources without compromising the independence of both the energy reservoirs/sources in case of a short circuit in one or more of the driver circuits.

Figure 2:
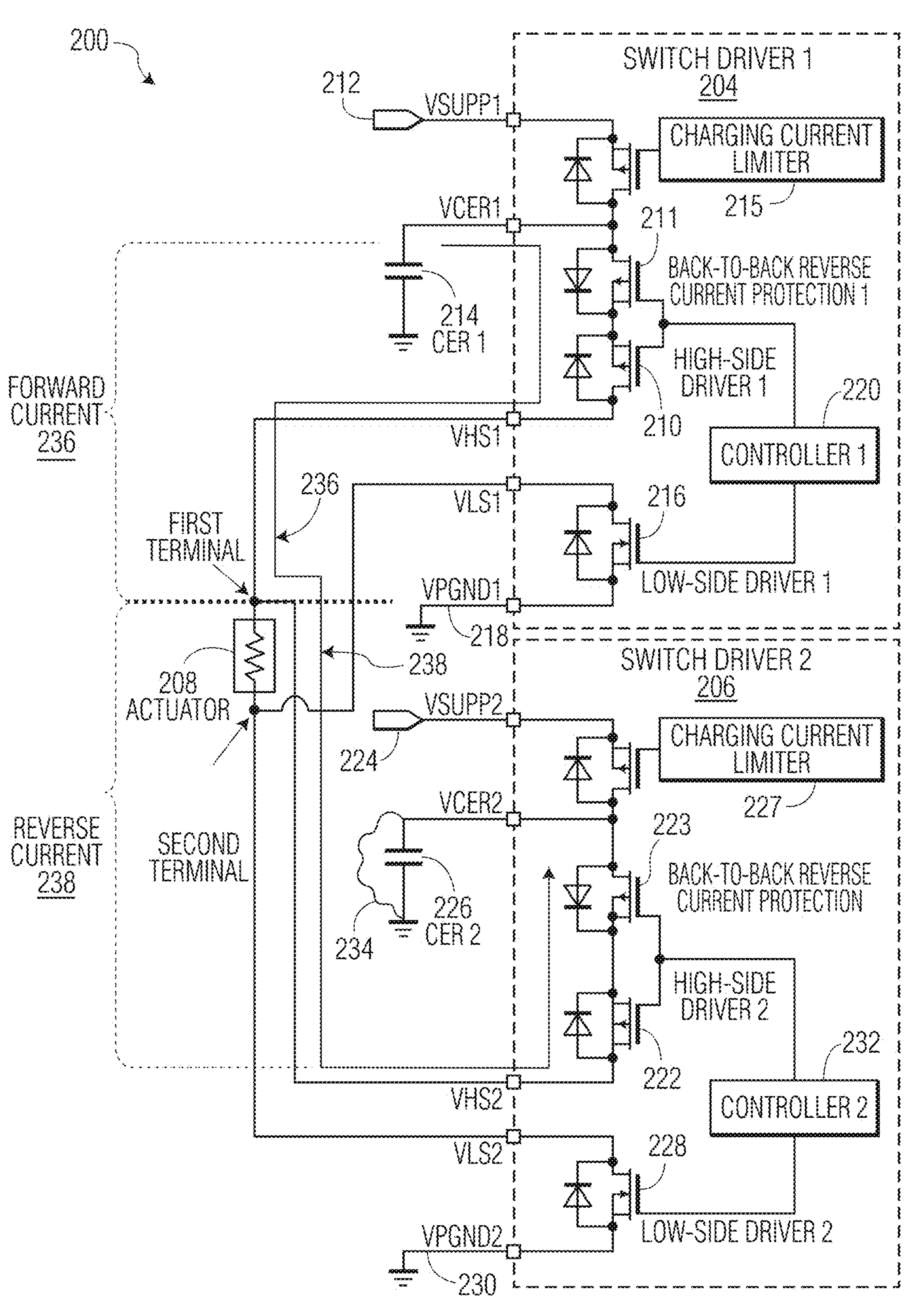
FIG. 2 represent a first example of a fault tolerant driver circuit.

FIG. 2 represent a first example 200 of a fault tolerant driver circuit. The first example fault tolerant driver circuit 200 includes a first driver circuit 204 (e.g. switch driver 1) and a second driver circuit 206 (e.g. switch driver 2) coupled in parallel to a load 208 (e.g. actuator, squib, igniter, pyro-electrical switch, etc.).

The first driver circuit 204 (e.g. switch driver 1) includes a first high-side element 210 (e.g. high-side driver 1) coupled to a first reverse current blocking element 211 and a first terminal of the load 208. The first reverse current blocking element 211 is coupled to a first energy storage element 214 (e.g. CER-1) and a first charging current limiter 215. The first charging current limiter 215 is coupled to a first supply voltage 212. The first driver circuit 204 (e.g. switch driver 1) also includes a first low-side element 216 (e.g. low-side driver 1) coupled between a first ground 218 (e.g. VPGND1) and a second terminal of the load 208. A first controller 220 (e.g. controller 1) is configured to control the first high-side element 210, the first reverse current blocking element 211, and the first low-side element 216.

The second driver circuit 206 (e.g. switch driver 2) includes a second high-side element 222 (e.g. high-side driver 2) coupled to a second reverse current blocking element 223 and the first terminal of the load 208. The second reverse current blocking element 223 is coupled to a second energy storage element 226 (e.g. CER-2) and a second charging current limiter 227. The second charging current limiter 227 is coupled to a second supply voltage 224. The second driver circuit 206 (e.g. switch driver 2) also includes a second low-side element 228 (e.g. low-side driver 2) coupled between a second ground 230 (e.g. VPGND2) and the second terminal of the load 208. A second controller 232 (e.g. controller 2) is configured to control the second high-side element 222, the second reverse current blocking element 223, and the second low-side element 228.

The switch driver circuits 204, 206 are configured to in parallel drive the load 208 (e.g. regulate a current sent to an actuator, squib, igniter, pyro-electrical switch, etc.). In some example embodiments, the first and second driver circuits 204, 206 supplement the power received from the power supplies 212, 224 with charges stored in their energy storage elements 214 (e.g. CER-1) 226 (e.g. CER-2) to further help drive the load 208.

The first reverse current blocking element 211 is configured to permit current flow from the first voltage supply 212 to the first high-side element 210, and to block current flow from the first high-side element 210 to the first voltage supply 212. Similarly, the second reverse current blocking element 223 is configured to permit current flow from the second voltage supply 224 to the second high-side element 222, and to block current flow from the second high-side element 222 to the second voltage supply 224.

Thus, should either the second supply voltage 224 and/or the second energy storage element 226 (e.g. CER-2) fail (e.g. short circuit 234), the second reverse current blocking element 223 prevents a forward current 236 from the first driver circuit 204 from becoming a reverse current 238 in the second driver circuit 206 because any such reverse current 238 is now blocked by the second reverse current blocking element 223. The first reverse current blocking element 211 in the first driver circuit 204 operates in a same manner. Thus the reverse current blocking elements 211, 223 prevent a failure in one driver circuit from draining current from another driver circuit.

The first example fault tolerant driver circuit 200 better ensures load 208 actuation if one or more of the redundant driver circuits 204, 206 fail (e.g. if an energy reservoir capacitor (CER-1 or CER-2) is shorted to ground). This is particularly useful when both the first and second switch driver circuits 204, 206 take their actuation energy mainly from the first and a second independent energy reservoir capacitors (CER-1, CER-2).

The reverse current blocking elements 211, 223 in this first example fault tolerant driver circuit 200 is an additional MOSFET connected in a back-to-back configuration with the first high-side element 210 which is also a MOSFET. Back-to-back transistors topology consists of connecting together the source of two transistors such as to control the current flowing forward and backward. This topology prevents unwanted current flowing through a transistor body diode by adding in series a transistor mounted in inversion. The gate command is common to the two transistors enabling the current following on both direction and generating a limited voltage drop or not flowing at all.

The reverse current protection elements 211, 223 prevent spurious energy reservoir capacitor (CER-1, CER-2) fast discharges through short circuits in either of the driver circuits 204, 206 during actuation of the load 208.

The charging current limiters 215, 227 prevent the supply voltages 212, 224 to collapse if either one of the energy storage elements 214, 226 (e.g. CER-1, CER-2) are shorted to ground. This is especially useful when the supply voltages 212, 224 (VSUPP1, VSUPP2) are connected to a common main supply voltage device.

In some example embodiments, the charging current limiters 215, 227 respectively monitor a voltage (e.g. VCER1, VCER2) at the energy storage elements 214, 226 (e.g. CER-1, CER-2). The charging current limiters 215, 227 are configured to block a charging current sent to the energy storage elements 214, 226 from their respective supply voltages 212, 224, if the monitored voltage (e.g. VCER1, VCER2) does not reach a predetermined voltage within a predetermined charging time. This can be an early indication that one or both of the energy storage elements 214, 226 (e.g. CER-1, CER-2) are defective (e.g. short circuited) and an energy storage element failure signal can be output to so indicate.

Figure 3:
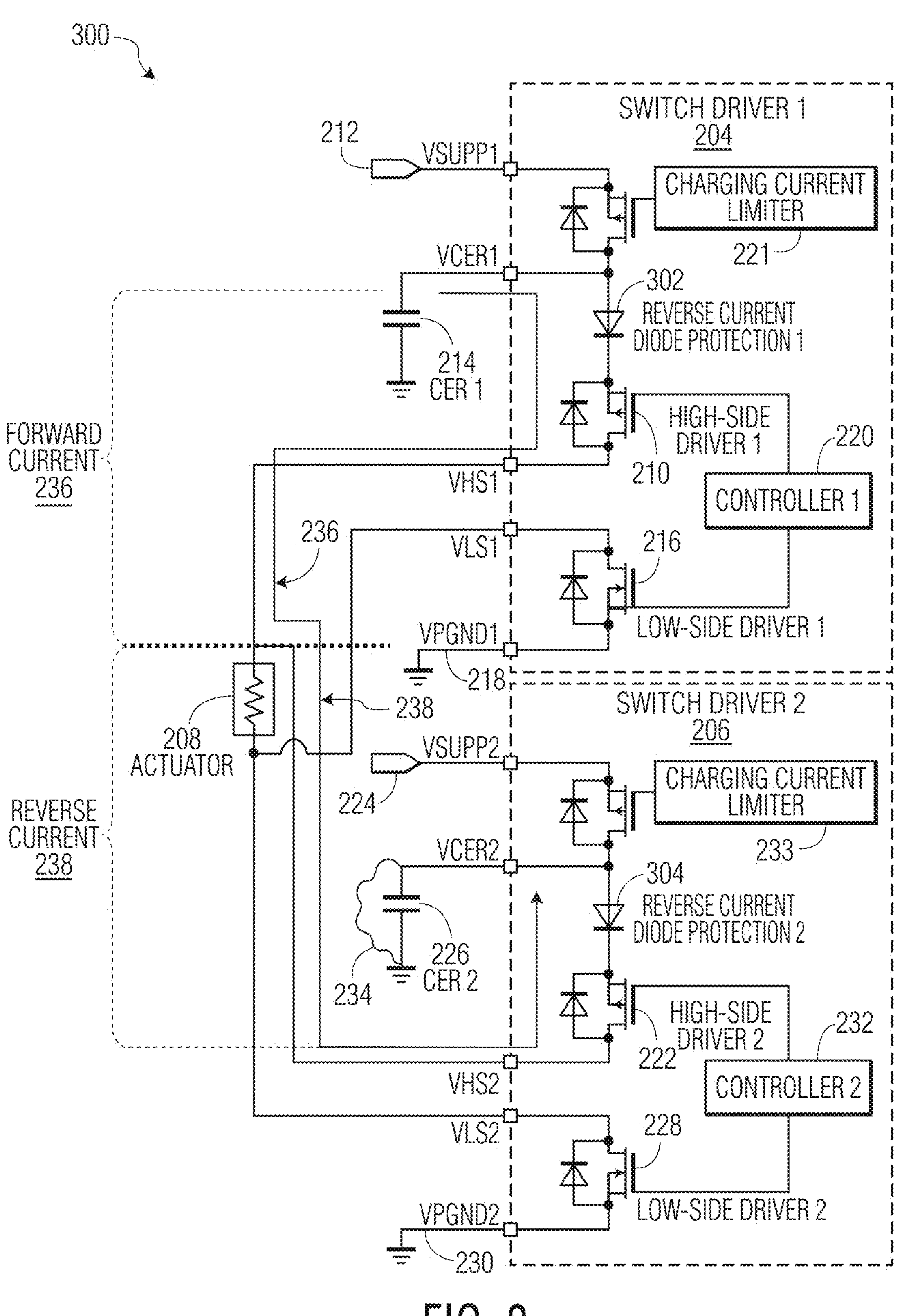
FIG. 3 represent a second example of the fault tolerant driver circuit.

FIG. 3 represent a second example 300 of the fault tolerant driver circuit. The second example fault tolerant driver circuit 300 is substantially similar to the first example fault tolerant driver circuit 200, except that the first reverse current blocking element 211 is replaced with a first reverse current blocking element 302, and the second reverse current blocking element 223 is replaced with a second reverse current blocking element 304.

The reverse current blocking elements 302, 304 in this second example fault tolerant driver circuit 300 is a diode connected in series with the first high-side element 210.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A driver system, comprising:

a high-side element coupled to receive a supply voltage and configured to be coupled to a first terminal of a load;

a low-side element coupled to a ground and configured to be coupled to a second terminal of the load;

a controller coupled to activate both the high-side element and the low-side element at a same time; and a reverse current blocking element coupled between the voltage supply and the high-side element;

wherein the reverse current blocking element is configured to permit current flow from the voltage supply to the high-side element, and to block current flow from the high-side element to the voltage supply wherein the driver circuit is a first driver circuit, the reverse current blocking element is a first reverse current blocking element, the voltage supply is a first voltage supply, and the high-side element is a first high-side element;

further comprising a second driver circuit having a second high-side element coupled to receive a second supply voltage and configured to be coupled to the first terminal of the load;

wherein the second driver circuit includes a second reverse current blocking element configured to permit current flow from the second voltage supply to the second high-side element, and to block current flow from the second high-side element to the second voltage supply;

wherein when the first driver circuit and second driver circuit are configured to both drive the load at the same time; and wherein the second reverse current blocking element is configured to block current flow from the first driver circuit to the second voltage supply.

2. The driver system of claim 1:

wherein the reverse current blocking element is a diode.

3. The driver system of claim 1:

wherein the reverse current blocking element is a MOSFET configured to be controlled by the controller.

4. The driver system of claim 3:

wherein the controller is configured to activate the high-side element, the low-side element, and the MOSFET at the same time.

5. The driver system of claim 1:

wherein the high-side element is a first MOSFET;

wherein the reverse current blocking element is a second MOSFET; and wherein the first and second MOSFETs are coupled in a back-to-back configuration.

6. The driver system of claim 1:

wherein the driver circuit is embedded in a BMS (Battery Management System) device.

7. The driver system of claim 6:

wherein the controller is configured to activate both the high-side element and the low-side element in response to a BMS safe command.

8. The driver system of claim 1:

wherein the load is at least one of an actuator, a pyro-electrical fuse, an igniter, or a squib.

9. The driver system of claim 1:

further comprising an energy storage element coupled to the reverse current blocking element and coupled to receive the supply voltage.

10. The driver system of claim 9:

wherein the energy storage element is a capacitor.

11. The driver system of claim 9:

further comprising a charging current limiter coupled between the voltage supply and the energy storage element.

12. The driver system of claim 11:

wherein the charging current limiter is configured to monitor a voltage at the energy storage element.

13. The driver system of claim 12:

wherein the charging current limiter is configured to block a charging current received from the supply voltage if the monitored voltage does not reach a predetermined voltage within a predetermined time.

14. The driver system of claim 13:

wherein the charging current limiter is configured to output an energy storage element failure signal upon blocking the charging current.

15. The driver system of claim 1:

wherein the second driver circuit is coupled to the load in parallel with the first driver circuit; and wherein the first driver circuit and the second driver circuit are configured to redundantly drive the load.

16. The driver system of claim 1:

wherein the first driver circuit and the second driver circuit are configured to redundantly drive the load in response to a single shared control signal.

17. The driver system of claim 1:

wherein the second voltage supply includes an energy storage element; and wherein the second reverse current blocking element is configured to block current flow from the first driver circuit to the energy storage element in the second driver circuit in response to a failure condition in the energy storage element.

18. The driver system of claim 1:

wherein the first and second drivers are configured to actuate the load in any order.

19. The driver system of claim 1:

wherein the second drivers is configured to actuate the load after a delay from when the first driver was configured to actuate the load.

20. The driver system of claim 1:

wherein there is more than one load that is actuated by either or both of the first and second drivers.

21. A driver circuit, comprising:

a high-side element coupled to receive a supply voltage and configured to be coupled to a first terminal of a load;

a low-side element coupled to a ground and configured to be coupled to a second terminal of the load;

a controller coupled to activate both the high-side element and the low-side element at a same time; and a reverse current blocking element coupled between the voltage supply and the high-side element;

wherein the reverse current blocking element is configured to permit current flow from the voltage supply to the high-side element, and to block current flow from the high-side element to the voltage supply;

wherein the high-side element is a first MOSFET;

wherein the reverse current blocking element is a second MOSFET; and wherein the first and second MOSFETs are coupled in a back-to-back configuration.

* * * * *